United States Patent
Fujiwara et al.

(10) Patent No.: US 10,401,218 B2
(45) Date of Patent: Sep. 3, 2019

(54) PHOTODETECTION DEVICE AND OBJECT DETECTION SYSTEM USING SAID PHOTODETECTION DEVICE

(71) Applicant: KABUSHIKI KAISHA TOSHIBA, Minato-ku (JP)

(72) Inventors: Ikuo Fujiwara, Yokohama (JP); Yuki Nobusa, Fuchu (JP); Honam Kwon, Kawasaki (JP); Kazuhiro Suzuki, Minato (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 55 days.

(21) Appl. No.: 15/703,145

(22) Filed: Sep. 13, 2017

(65) Prior Publication Data

US 2018/0266881 A1 Sep. 20, 2018

(30) Foreign Application Priority Data

Mar. 16, 2017 (JP) ................ 2017-051650

(51) Int. Cl.
*G01J 1/44* (2006.01)
*G01V 8/10* (2006.01)
*H01L 27/144* (2006.01)
*H01L 31/107* (2006.01)

(52) U.S. Cl.
CPC ............ *G01J 1/44* (2013.01); *G01V 8/10* (2013.01); *H01L 27/1443* (2013.01); *H01L 31/107* (2013.01); *G01J 2001/444* (2013.01); *G01J 2001/4466* (2013.01)

(58) Field of Classification Search
CPC .. G01J 1/44; G01J 2001/442; G01J 2001/444; G01J 2001/446; G01J 2001/4466; G01V 8/10; G01V 8/12; G01V 8/20; G01V 8/18; G01V 8/26; H01L 27/1443; H01L 27/144; H01L 31/107; H01L 31/102; H01L 31/101; H01L 31/10
See application file for complete search history.

(56) References Cited

U.S. PATENT DOCUMENTS 6,320,281 B1 * 11/2001 Zakharian ............... H02M 3/07
  307/108
7,081,609 B2    7/2006 Matsumoto
9,040,898 B2 *  5/2015 Henseler ................. G01T 1/248
  250/214.1
(Continued)

FOREIGN PATENT DOCUMENTS

JP    06-009157 U    2/1994
JP    06-224463      8/1994
(Continued)

*Primary Examiner* — John R Lee
(74) *Attorney, Agent, or Firm* — Oblon, McClelland, Maier & Neustadt, L.L.P.

(57) ABSTRACT

An photodetection device according to an embodiment includes: a pixel including at least one cell, the at least one cell including an avalanche photodiode and a resistor connected in series to the avalanche photodiode; a voltage source configured to apply voltage to the cell of the pixel; and a temperature detecting circuit including a temperature detecting element configured to detect a temperature of the pixel, wherein the temperature detecting element includes: a photodiode having the same structure as the avalanche photodiode; and a light shielding structure disposed on an upper surface of the photodiode.

13 Claims, 11 Drawing Sheets

(56) References Cited

U.S. PATENT DOCUMENTS

| | | | |
|---|---|---|---|
| 9,310,247 B2* | 4/2016 | Raynor | G01J 1/1626 |
| 9,366,566 B2* | 6/2016 | Frank | G01J 1/18 |
| 9,523,776 B2* | 12/2016 | Kuroda | G01T 1/169 |
| 9,810,795 B2* | 11/2017 | Jackson | H01L 27/1446 |
| 10,064,585 B2* | 9/2018 | Kimura | A61B 6/4241 |
| 2003/0071196 A1* | 4/2003 | Seitz | H01L 27/1443 |
| | | | 250/214.1 |
| 2007/0023614 A1* | 2/2007 | Park | H04N 3/1568 |
| | | | 250/214.1 |
| 2008/0203309 A1* | 8/2008 | Frach | G01T 1/1642 |
| | | | 250/362 |
| 2010/0308345 A1* | 12/2010 | Brown | G02F 1/13318 |
| | | | 257/82 |
| 2011/0315859 A1* | 12/2011 | Tanaka | G09G 3/3648 |
| | | | 250/214 R |
| 2013/0153975 A1* | 6/2013 | Henseler | G01T 1/248 |
| | | | 257/290 |
| 2013/0168535 A1* | 7/2013 | Eldesouki | G01J 1/44 |
| | | | 250/214.1 |
| 2013/0313414 A1* | 11/2013 | Pavlov | H01L 31/0224 |
| | | | 250/214.1 |
| 2014/0353471 A1* | 12/2014 | Raynor | G01J 1/1626 |
| | | | 250/214 C |
| 2016/0284878 A1* | 9/2016 | Zarkesh-Ha | H01L 31/02027 |
| 2017/0263798 A1* | 9/2017 | Suzuki | G01S 17/08 |
| 2017/0301716 A1* | 10/2017 | Irish | H01L 27/14609 |
| 2018/0019825 A1* | 1/2018 | Shirai | H04B 10/69 |
| 2018/0266879 A1* | 9/2018 | Lee | G01J 1/4204 |
| 2018/0266881 A1* | 9/2018 | Fujiwara | G01J 1/44 |
| 2018/0343406 A1* | 11/2018 | Ikedo | H04N 5/369 |
| 2018/0364356 A1* | 12/2018 | Eichenholz | G01S 17/105 |

FOREIGN PATENT DOCUMENTS

| | | | |
|---|---|---|---|
| JP | 4147997 | 9/2008 | |
| JP | 2009-105489 | 5/2009 | |
| JP | 2013-016638 | 1/2013 | |
| JP | 2014-092447 | 5/2014 | |
| JP | 5546806 | 7/2014 | |
| WO | WO-2010070487 A3 * | 5/2011 | G01T 1/2018 |

* cited by examiner

PHOTODETECTION DEVICE AND OBJECT DETECTION SYSTEM USING SAID PHOTODETECTION DEVICE

CROSS REFERENCE TO RELATED APPLICATIONS

This application is based upon and claims the benefit of priority from the prior Japanese Patent Application No. 2017-051650, filed on Mar. 16, 2017, the entire contents of which are incorporated herein by reference.

FIELD

Embodiments described herein relate generally to photodetection devices and object detection systems using the photodetection devices.

BACKGROUND CIRCUIT

In a photodetection element such as an avalanche photodiode or a silicon photomultiplier (hereinafter also referred to as SiPM), photon detection efficiency (also called PDE) has a high temperature dependence. Therefore, in a case where a photodetection element is used outdoors like an on-vehicle photodetection element, the chip needs to be maintained at a constant temperature with the use of a chip temperature monitor such as a thermistor, and a Peltier element or a heater or the like. As a result, the device becomes larger in size, and power consumption also becomes larger. Furthermore, a temperature monitor formed with a different chip from the main body of the photodetection element has a poor accuracy in reproduction of an actual device temperature, and causes a decrease in temperature correction accuracy.

The photon detection efficiency of a SiPM is expressed by a product of the aperture ratio S of the device, the photoelectric conversion efficiency q, and the avalanche probability $P_{av}$. The avalanche probability $P_{av}$ that has large influence as temperature characteristics can be expressed experientially as $$P_{av} = P_0 \times (1 - \exp(-a \times V_{ov})).$$

Here, "$P_0$" is a constant that does not depend on temperature, and "a" is a constant attributed to the device structure. Meanwhile, the voltage $V_{ov}$ is expressed as $$V_{ov} = V_{op} - V_{bd},$$

where $V_{bd}$ represents the breakdown voltage $V_{bd}$ of the device, and $V_{op}$ represents the drive voltage $V_{op}$ of the device.

Therefore, in a case where the drive voltage $V_{op}$ is constant, the breakdown voltage $V_{bd}$ changes. As a result, the voltage $V_{ov}$ changes, the avalanche probability $P_{a}y$ changes, and the temperature dependence of photon detection efficiency appears. In view of this, to reduce the temperature dependence of photon detection efficiency, the temperature dependence of the breakdown voltage $V_{bd}$ needs to be corrected.

The breakdown voltage $V_{bd}$ of a photodetection element (photodetection device) normally exhibits substantially linear variation with device temperature. As is apparent from this, temperature correction can be performed. However, the influence of variation of the breakdown voltage $V_{bd}$ between devices cannot be ignored, either. Therefore, in a case where a large number of pixels are employed as in a SiPM, it is also necessary to correct variation of the breakdown voltage $V_{bd}$ of each pixel.

DETAILED DESCRIPTION

An photodetection device according to an embodiment includes: a pixel including at least one cell, the at least one cell including an avalanche photodiode and a resistor connected in series to the avalanche photodiode; a voltage source configured to apply voltage to the cell of the pixel;

and a temperature detecting circuit including a temperature detecting element configured to detect a temperature of the pixel, wherein the temperature detecting element includes a photodiode having the same structure as the avalanche photodiode, and a light shielding structure disposed on an upper surface of the photodiode.

The following is a description of embodiments of the present invention, with reference to the accompanying drawings.

(First Embodiment)

Figure 1:
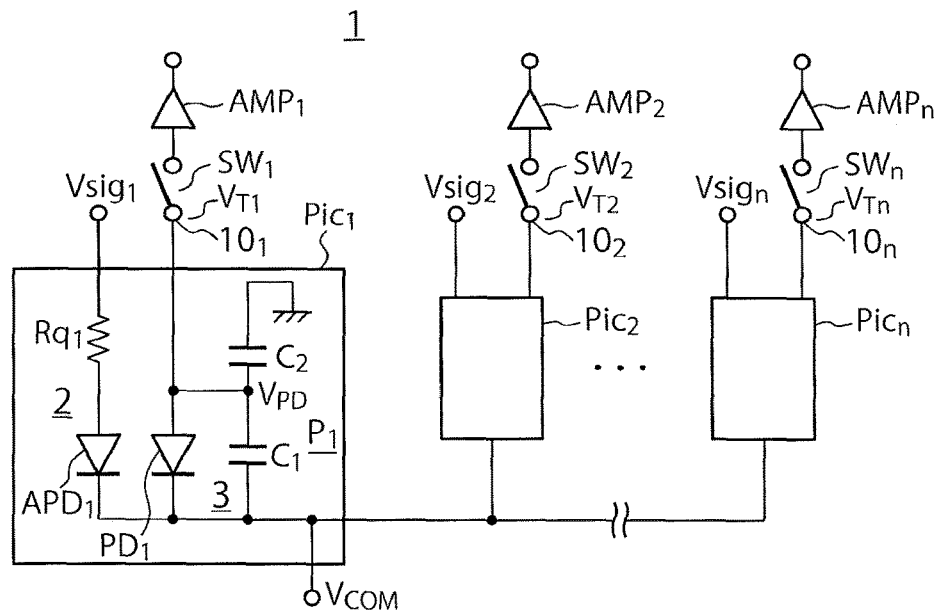
FIG. 1 is a circuit diagram showing a photodetection device according to a first embodiment.

FIG. 1 is a circuit block diagram of a photodetection device according to a first embodiment. The photodetection device 1 of the first embodiment includes photodetection pixels $Pic_1$ through $Pic_n$ arranged in a linear array, and each pixel $Pic_i$ (i=1, ..., n) is connected to a common power source $V_{COM}$. In this embodiment, for example, 68 V is applied as the power source $V_{COM}$. Each pixel $Pic_i$ (i=1, ..., n) includes an optical signal detecting circuit 2 and a device temperature detecting circuit 3.

The optical signal detecting circuit 2 of each pixel $Pic_i$ (i=1, ..., n) includes an avalanche photodiode $APD_i$ that operates in Geiger mode, a quench resistor $Rq_i$, and an output circuit $Vsig_i$ that outputs an optical pulse signal from the avalanche photodiode $APD_i$. The cathode of the avalanche photodiode $APD_i$ is connected to the power source $V_{COM}$, the anode is connected to one terminal of the quench resistor $Rq_i$, and the output circuit $Vsig_i$ is connected to the other terminal of the quench resistor $Rq_i$. That is, the avalanche photodiode $APD_i$, the quench resistor $Rq_i$, and the output circuit $Vsig_i$ are connected in series. The output circuit $Vsig_i$ is fixed to the ground potential through an external read circuit (not shown).

Photons that enter the avalanche photodiode $APD_i$ (i=1, ..., n) are photoelectrically converted and avalanche-amplified, and a fast pulse in several tens of nanoseconds is output from the optical pulse signal output circuit $Vsig_i$. At this stage, the multiplication coefficient for determining the intensity of an optical signal and the pulse time constant that affects the sensor dead time are proportional to parasitic capacitance, and therefore, increase in parasitic capacitance due to addition of a temperature correction mechanism or the like is preferably avoided.

In view of this, the device temperature detecting circuit 3 is added to each pixel $Pic_i$ (i=1, ..., n) in this embodiment. The device temperature detecting circuit 3 detects the temperature of the substrate (not shown) on which the pixels are formed. The device temperature detecting circuit 3 includes a photodiode $PD_i$ that operates in a reverse saturation region and is shielded from light, a voltage applying circuit $P_i$ that applies an operating voltage to the photodiode $PD_i$, and a terminal $10_i$ that outputs device temperature information $V_{Ti}$. The avalanche photodiode $APD_i$ (i=1, ..., n) and the photodiode $PD_i$ are formed with the use of the same plane pattern shape and the same process steps, and the photodiode $PD_i$ is disposed in the vicinity of the avalanche photodiode $APD_i$ in each pixel. That is, the photodiode $PD_i$ and the avalanche photodiode $APD_i$ have substantially the same structures.

As will be described later, a light shielding film (denoted by reference numeral 614 in FIGS. 13A and 13B) is formed above each photodiode $PD_i$ (i=1, ..., n).

Figure 2:
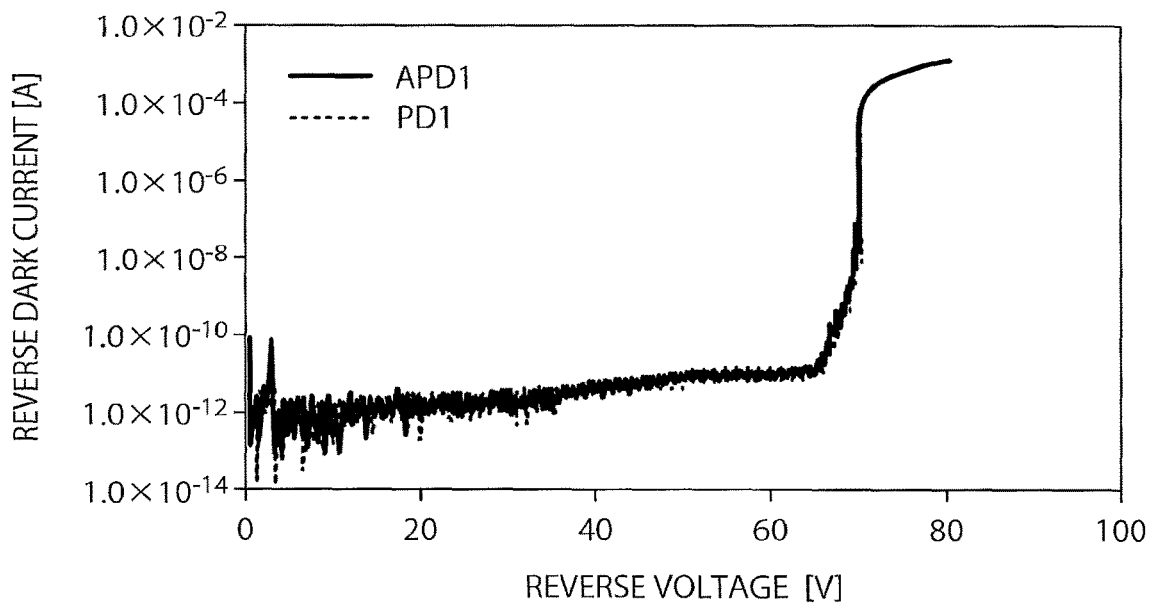
FIG. 2 is a graph showing the relationship between the reverse voltage and the reverse dark current of a photodiode.

FIG. 2 shows the results of measurement of the reverse voltage dependence of the reverse dark current of the photodiode $PD_i$ (i=1, ..., n). As can be seen from FIG. 2, the photodiode $PD_i$ (i=1, ..., n) has characteristics equivalent to the current-voltage characteristics and the temperature dependence of the avalanche photodiode $APD_i$. That is, the characteristics of the avalanche photodiode $APD_i$ can be reproduced with the characteristics of the photodiode $PD_i$ (i=1, ..., n).

In the first embodiment shown in FIG. 1, the voltage applying circuit $P_i$ that applies an operating voltage to the photodiode $PD_i$ (i=1, ..., n) is embodied by capacitance dividing between the power source $V_{COM}$ and the ground potential with a capacitance $C_1$ and a capacitance $C_2$. That is, the bias voltage Vpd to be applied to the photodiode $PD_i$ (i=1, ..., n) is $$Vpd = C_1/(C_1+C_2) \times V_{COM}.$$

Since $C_1$=10 pF, $C_2$=1 pF, and $V_{COM}$=68 V in this embodiment, the bias voltage Vpd is 62 V, which is a reverse saturation voltage not higher than the breakdown voltage Vbd.

Figure 3:
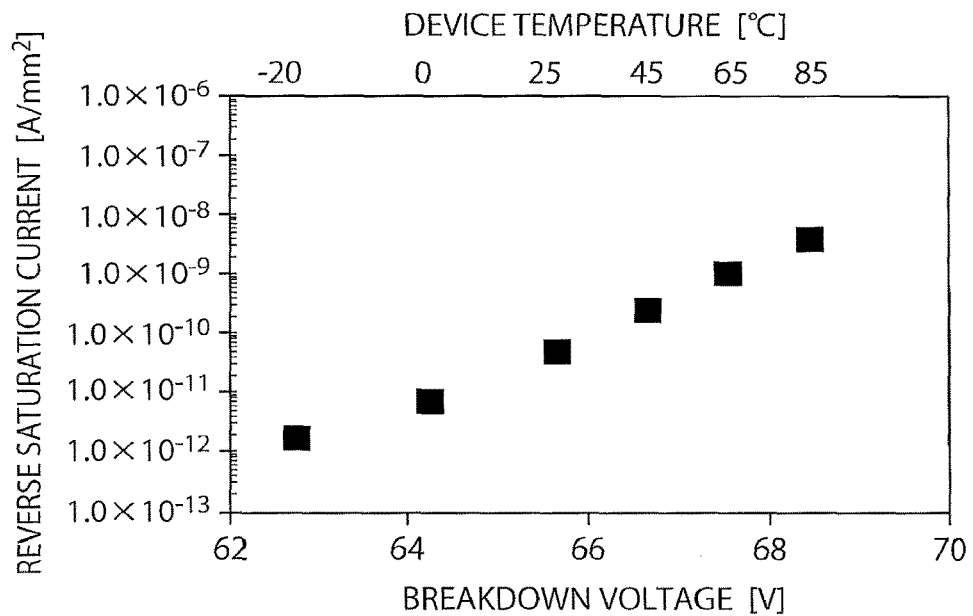
FIG. 3 is a graph showing the relationship between the value of the breakdown voltage of an avalanche photodiode and the reverse saturation dark current of a photodiode.

FIG. 3 shows the relationship between the value of the breakdown voltage Vbd and the reverse saturation dark current Ir (A/mm$^2$) of the photodiode $PD_i$ (i=1, ..., n) in a case where the device temperature of the avalanche photodiode $APD_i$ (i=1, ..., n) is changed. As can be seen from FIG. 3, the reverse saturation dark current Ir exponentially varies with changes in the breakdown voltage Vbd. Therefore, it is possible to obtain information about variation of the breakdown voltage Vbd of the avalanche photodiode $APD_i$ with temperature by monitoring the reverse saturation dark current Ir of the photodiode $PD_i$ (i=1, ..., n). That is, it is possible to read device temperature information with a conventional read circuit by detecting the reverse dark current Ir.

In the first embodiment shown in FIG. 1, each pixel $Pic_i$ (i=1, ..., n) further includes a current-voltage converting amplifier $AMP_i$ that receives the reverse dark current Ir of the photodiode $PD_i$, and a switch $SW_i$ that serves as a pixel select circuit. One terminal of the switch $SW_i$ (i=1, ..., n) is connected to the terminal $10_i$, and the other terminal is connected to an input terminal of the current-voltage converting amplifier $AMP_i$. With this configuration, device temperature information is obtained. As for the technique for reading, the reverse dark current of the photodiode $PD_i$ (i=1, ..., n) may be integrated for a certain period of time, and device temperature information may be read as electric charge. However, the technique for reading is not limited to this technique.

Figure 4:
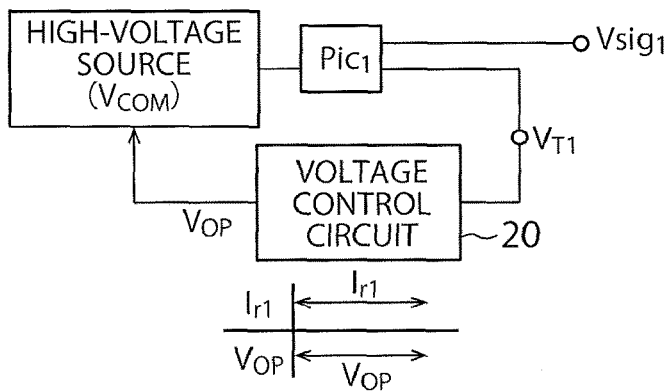
FIG. 4 is a diagram for explaining a technique for performing ambient temperature correction in the photodetection device of the first embodiment.

FIG. 4 is a diagram for explaining a technique for performing ambient temperature correction, using the device temperature information $V_{T1}$ output from the terminal $10_1$ of the pixel $Pic_1$. This embodiment further includes a voltage control circuit 20. The device temperature information $V_{T1}$ output from the pixel $Pic_1$ is input to the voltage control circuit 20 outside the chip. A correlation table of the device temperature information $V_{T1}$ and a drive voltage Vop is stored in the voltage control circuit 20. In the voltage control circuit 20, the device temperature information $V_{T1}$ is converted into the drive voltage Vop in accordance with the correlation table, and is output as a converted signal to a high-voltage source $V_{COM}$. As a result, the drive voltage Vop is corrected in accordance with variation of the breakdown voltage Vbd with temperature. Thus, the drive voltage Vop is fixed to a constant value at any device temperature, and variation of photon detection efficiency with temperature is reduced. Although a technique for performing ambient temperature correction using the device temperature information $V_{T1}$ output from the terminal $10_1$ of the pixel $Pic_i$ has been described with reference to FIG. 4, the ambient temperature correction is performed for the other pixels in the same manner.

(First Modification)

Figure 5:
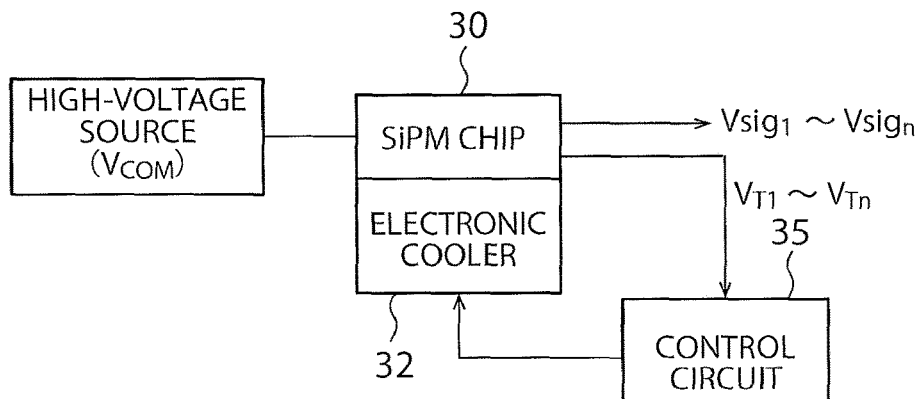
FIG. 5 is a diagram for explaining a technique for performing ambient temperature correction in a photodetection device according to a first modification of the first embodiment.

Referring now to FIG. 5, a first modification of the first embodiment is described. FIG. 5 is a diagram for explaining a technique for performing ambient temperature correction using device temperature information $V_{T1}$ in a photodetection device according to the first modification.

As shown in FIG. 5, the first modification further includes an electronic cooler 32 for maintaining a SiPM chip 30 at a constant temperature, and a control circuit 35 that controls the electronic cooler 32. Device temperature information $V_{T1}$ through $V_{Tn}$ output from the SiPM chip 30 is input to the control circuit 35, and is converted into temperature control signals for the electronic cooler 32. As a result, the temperature of the SiPM chip 30 is maintained at a constant temperature by the electronic cooler 32, and variation of photon detection efficiency with temperature due to ambient temperature variation is reduced.

Also, the technique for applying the bias voltage Vpd is not limited to the technique utilizing capacitance dividing with the capacitance $C_1$ and the capacitance $C_2$, and may be replaced with a technique using a special voltage source that generates voltages that do not exceed the breakdown voltage Vbd.

(Second Modification)

Figure 6:
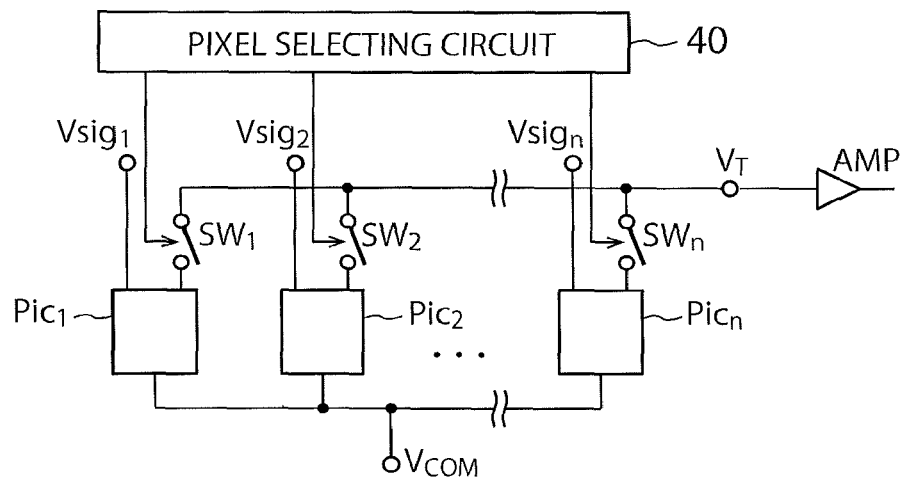
FIG. 6 is a circuit diagram showing a photodetection device according to a second modification of the first embodiment.

FIG. 6 shows a photodetection device according to a second modification of the first embodiment. The photodetection device of the second modification is used in cases where the number of pixels is large and there is no space for wiring lines, and has the same configuration as the first embodiment shown in FIG. 1, except that the current-voltage converting amplifier $AMP_i$ (i=1, ..., n) provided for each pixel is replaced with a single current-voltage converting amplifier AMP. That is, the current-voltage converting amplifier AMP is connected to the terminal $10_i$ (i=1, ..., n) of each pixel $Pic_i$ via each corresponding switch $SW_i$. Further, a pixel selecting circuit 40 that is located outside the chip and turns on the switch corresponding to the pixel to be selected by sending a pixel select signal to the switch is added to the configuration. In a case where the pixel to be selected is the pixel $Pic_1$, for example, the pixel select signal is sent to the switch $SW_1$, to turn the switch $SW_1$ on.

In the second modification, the technique described in the first modification may be used as the technique for performing ambient temperature correction.

(Third Modification)

Figure 7:
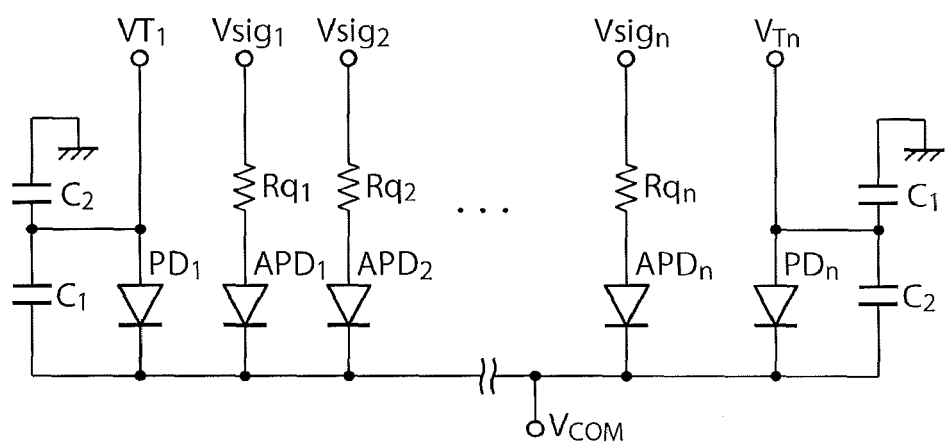
FIG. 7 is a circuit diagram showing a photodetection device according to a third modification of the first embodiment.

FIG. 7 shows a photodetection device according to a third modification of the first embodiment. The photodetection device of the third modification is the same as the photodetection device of the first embodiment shown in FIG. 1, except that the device temperature detecting circuit 3 is removed from each pixel $Pic_i$ (i=2, ..., n−1), except for the pixel $Pic_1$ and the pixel $Pic_n$, and the device temperature information $V_{Ti}$ about each pixel $Pic_i$ (i=2, ..., n−1) is determined in accordance with the device temperature information $V_{T1}$ and the device temperature information $V_{Tn}$ detected by the device temperature detecting circuits 3 of the pixels $Pic_1$ and $Pic_n$.

In a first example, the device temperature information $V_{Ti}$ about each pixel $Pic_i$ (i=2, ..., n−1) may be the mean value of the device temperature information $V_{T1}$ and the device temperature information $V_{Tn}$, or $V_{Ti}=(V_{T1} V_{Tn})/2$. In this case, the average output of the device temperature detecting circuits 3 is used, so that measurement variation can be reduced.

In a second example, the device temperature information $V_{Ti}$ of each pixel $Pic_i$ (i=2, ..., n−1) may be determined by linear approximation of $V_{T1}$ and $V_{Tn}$. That is, $V_{Ti}$ may be expressed as $$V_{Ti}=i\times(V_{T1}-V_{Tn})/n+V_{Tn}.$$

In this case, the temperature distribution in the linear array can be accurately reflected.

In the third modification, the technique described in the first or second modification may be used as the technique for performing ambient temperature correction.

(Manufacturing Method)

Referring now to FIGS. 8A through 13B, a method of manufacturing the photodetection device of the first embodiment is described. FIGS. 8A, 9A, 10A, 11A, 12A, and 13A are plan views showing the respective manufacturing steps, and FIGS. 8B, 9B, 10B, 11B, 12B, and 13B are cross-sectional views showing the respective manufacturing steps. Each of the cross-sectional views is a cross-sectional view taken along the section line A-A defined in each corresponding plan view.

Figure 8A:
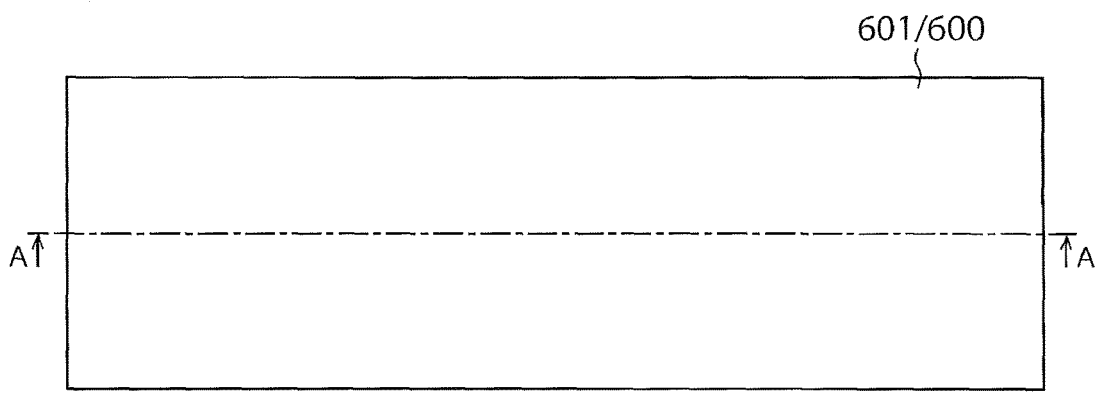
FIGS. 8A and 8B are a plan view and a cross-sectional view showing a step in a process of manufacturing the photodetection device of the first embodiment.
Figure 8B:
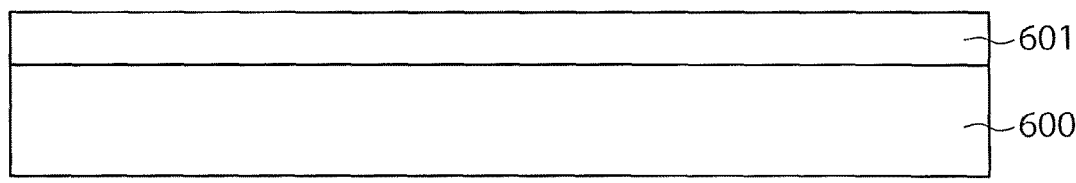

As shown in FIGS. 8A and 8B, to manufacture the photodetection device of the first embodiment, a wafer formed by epitaxially growing a silicon epitaxial layer 601 doped with boron at a concentration of $1.0\times10^{15}$ cm$^{-3}$ to a thickness of 3 μm is prepared on a single-crystal N-type silicon substrate 600 doped with antimony at a concentration of $2.0\times10^{18}$ cm$^{-3}$.

Figure 9A:
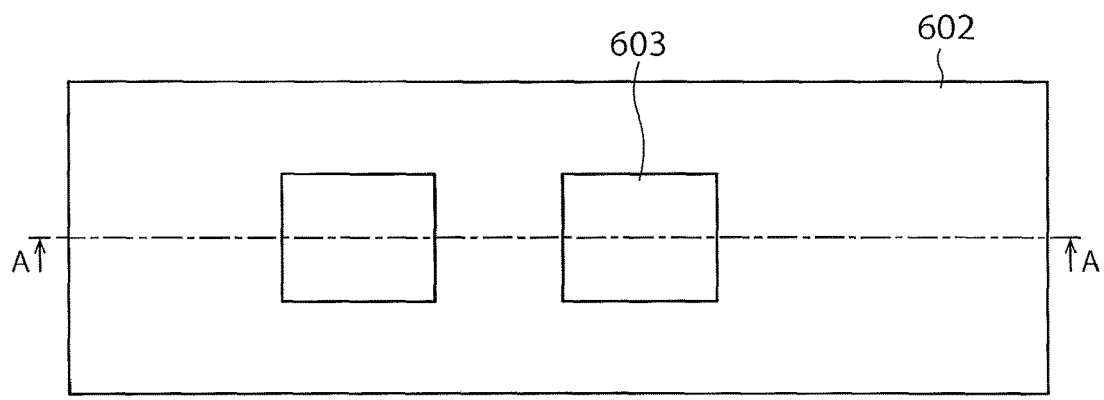
FIGS. 9A and 9B are a plan view and a cross-sectional view showing a step in a process of manufacturing the photodetection device of the first embodiment.
Figure 9B:
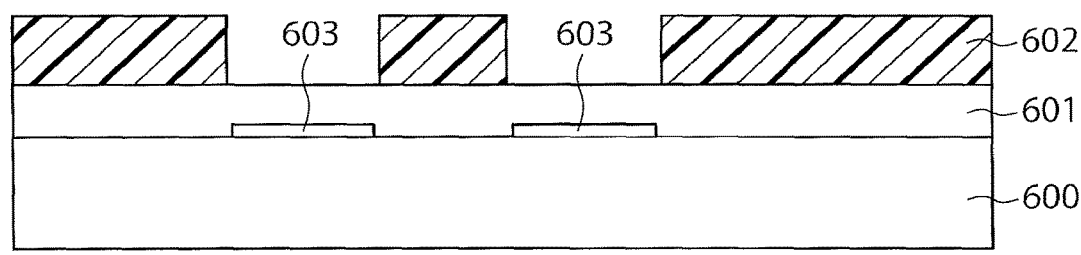

As shown in FIGS. 9A and 9B, a resist pattern 602 that defines the device region is then formed by a lithography process. With this resist pattern 602 serving as a mask, boron ions are implanted at an accelerating voltage of 2.4 MeV, with the dose amount being $2.0\times10^{12}$ cm$^{-3}$. In this manner, a deep P-type layer 603 is formed.

Figure 10A:
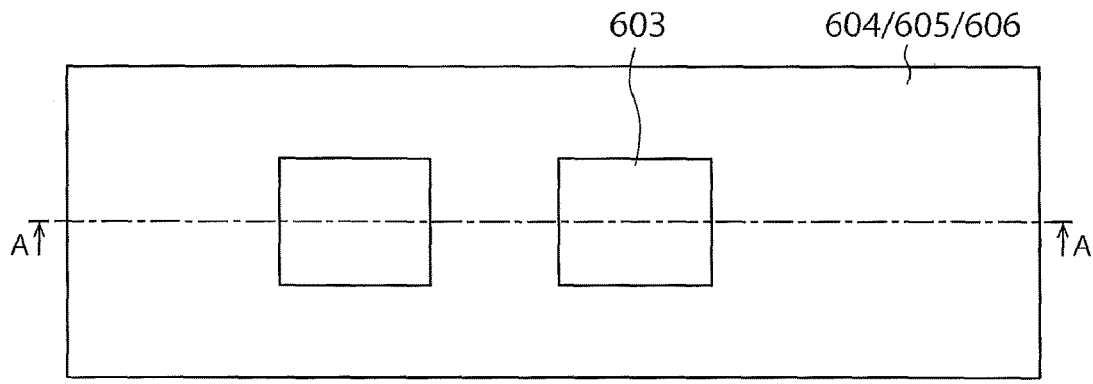
FIGS. 10A and 10B are a plan view and a cross-sectional view showing a step in a process of manufacturing the photodetection device of the first embodiment.
Figure 10B:
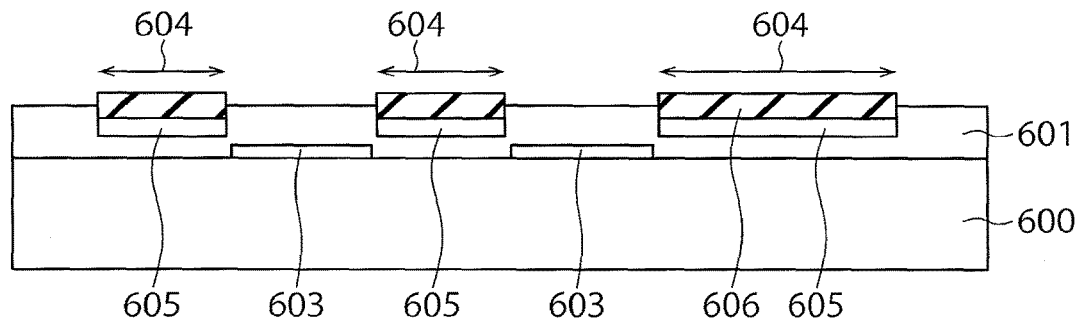

As shown in FIGS. 10A and 10B, a pattern (not shown) that has an opening in a device separating region 604 and serves as a mask is then used, and phosphorus ions are implanted at an accelerating voltage of 150 keV, with the dose amount being $1.0\times10^{12}$ cm$^{-3}$. In this manner, a device separating diffusion layer 605 is formed. A conventional LSI manufacturing step is then carried out, to form a device separating structure 606 in the surface of the silicon epitaxial layer 601 by LOCOS (Local Oxidation) technique. The P-type layer 603 and the device separating diffusion layer 605 are activated by the oxidation process performed in this step.

Figure 11A:
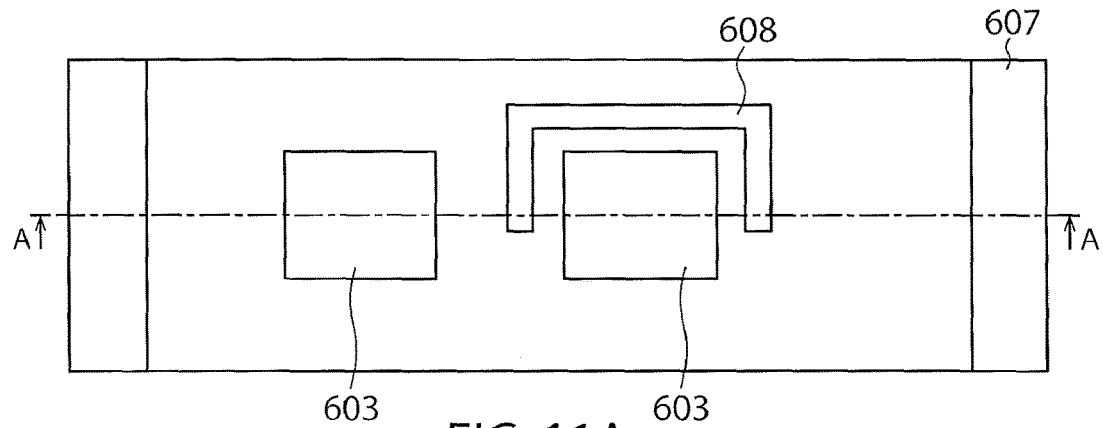
FIGS. 11A and 11B are a plan view and a cross-sectional view showing a step in a process of manufacturing the photodetection device of the first embodiment.
Figure 11B:
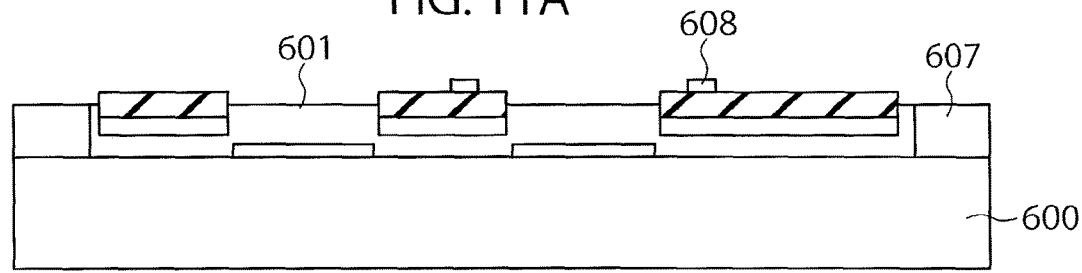

As shown in FIGS. 11A and 11B, to separate the pixels from one another, a deep N-type diffusion layer 607 is then formed so as to penetrate through the epitaxial layer 601 and reach the N-type substrate 600. A 0.2-μm thick polysilicon film 608 that is to serve as the quench resistors is then formed by CVD (Chemical Vapor Deposition), and is processed into a predetermined shape by lithography and RIE (Reactive Ion Etching). To obtain a predetermined resistance, boron is implanted into the polysilicon film 608 at an accelerating voltage of 20 keV, with the dose amount being approximately $1.0\times10^{15}$ cm$^{-3}$. Thus, the polysilicon film 608 is activated.

Figure 12A:
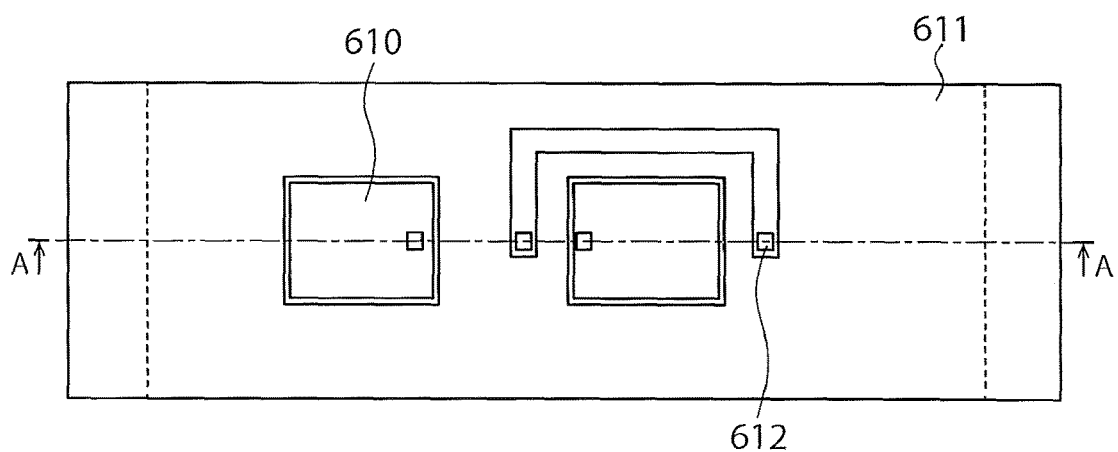
FIGS. 12A and 12B are a plan view and a cross-sectional view showing a step in a process of manufacturing the photodetection device of the first embodiment.
Figure 12B:
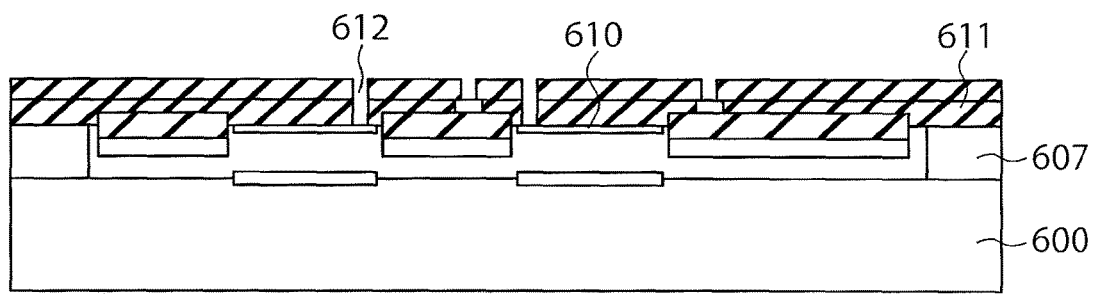

As shown in FIGS. 12A and 12B, a shallow P-type layer 610 for forming an ohmic junction between the silicon epitaxial layer 601 and a metal electrode 613 is formed in the device region by boron ion implantation at an accelerating voltage of 40 keV, with the dose amount being $1.0\times10^{14}$ cm$^{-3}$, followed by activation. A 0.8-μm thick insulating film layer 611 is then formed by CVD, and contact holes 612 are formed by lithography and RIE.

Figure 13A:
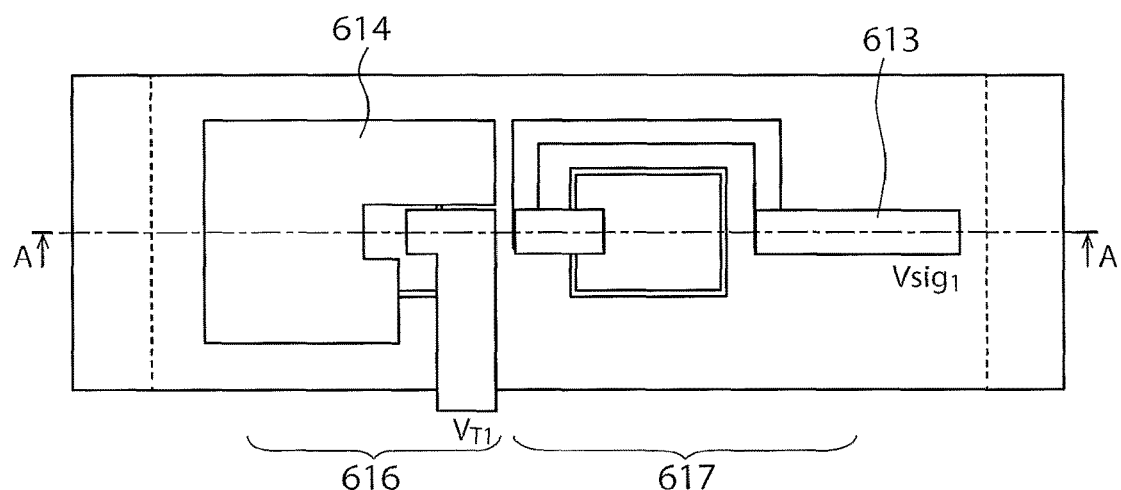
FIGS. 13A and 13B are a plan view and a cross-sectional view showing a step in a process of manufacturing the photodetection device of the first embodiment.
Figure 13B:
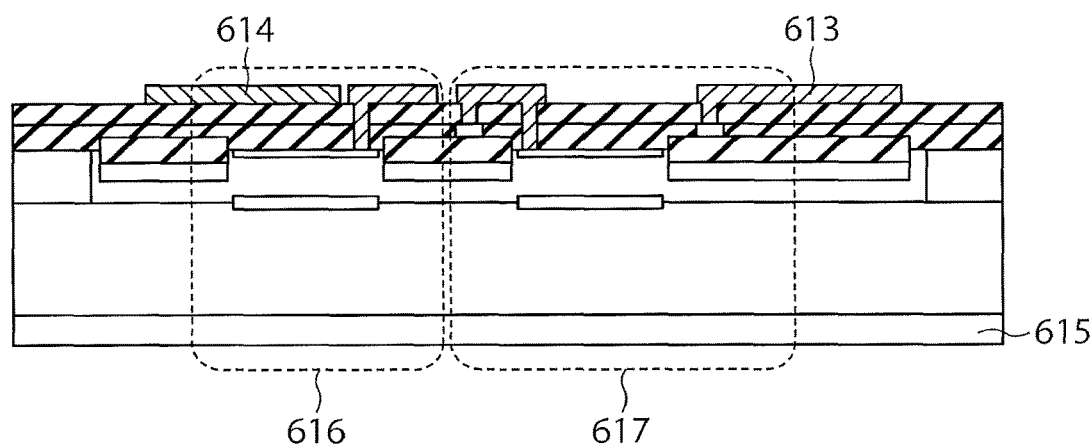

As shown in FIGS. 13A and 13B, a 0.8-μm thick aluminum electrode 613 is then formed by sputtering, and is processed into a predetermined shape by lithography and RIE. At this stage, the aluminum electrode in the area of the photodiode PD of the device temperature detecting circuit 3 is used as a light shielding film 614. Lastly, a Ti/Au film is formed as the common electrode $V_{COM}$ on the back surface of the N-type substrate 600.

In the above described manner, the avalanche photodiode 617 of each optical signal detecting circuit 2 and the photodiode 616 of each device temperature detecting circuit 3 can be manufactured.

Figure 14A:
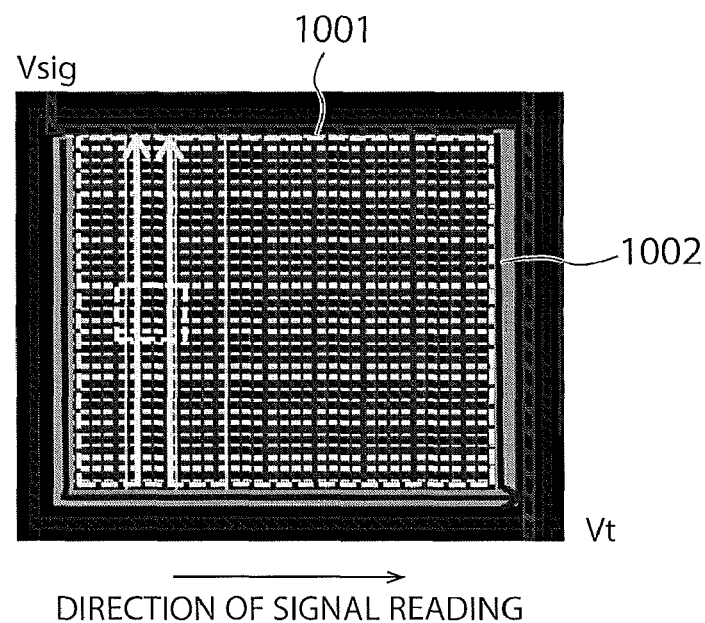
FIG. 14A is a plan view of a silicon photomultiplier (SiPM).
Figure 14B:
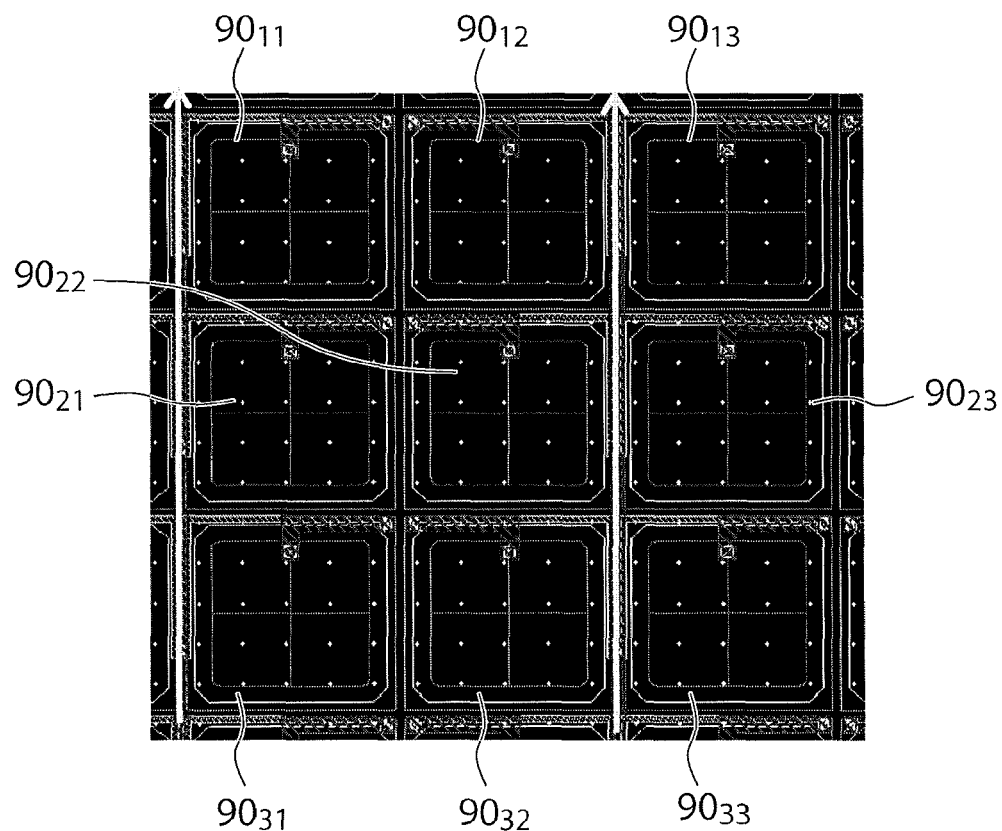
FIG. 14B is a plan view showing pixels.

Although a photodetection device having avalanche photodiodes arranged in a one-dimensional array has been described so far, this embodiment can be applied to a silicon photomultiplier (SiPM) in which one pixel is formed with cells that have a quench resistor connected in series to an avalanche photodiode and are arranged in a two-dimensional array. FIG. 14A is a plan view of a silicon photomultiplier (SiPM). FIG. 14B shows pixels $90_{11}$ through $90_{33}$ arranged in a (3×3) array. In each pixel $90_{ij}$ (i, j=1, ..., 3), a pixel center region preferably serves as a light detecting circuit 1001 to increase photodetection efficiency, and an element in the peripheral region in the pixel preferably serves as the photodiode PD of a temperature detecting circuit 1002, as shown in FIG. 14B. As outputs of the photodiodes PD arranged as the temperature detecting circuits 1002 in the pixel peripheral region are connected in parallel, device temperature information $V_T$ is amplified and is then averaged. Thus, the device temperature information $V_T$ can be more accurately read.

As described above, according to the first embodiment and the modifications thereof, it is possible to provide a photodetection device that can reduce variation of photon detection efficiency with temperature.

(Second Embodiment)

Figure 15:
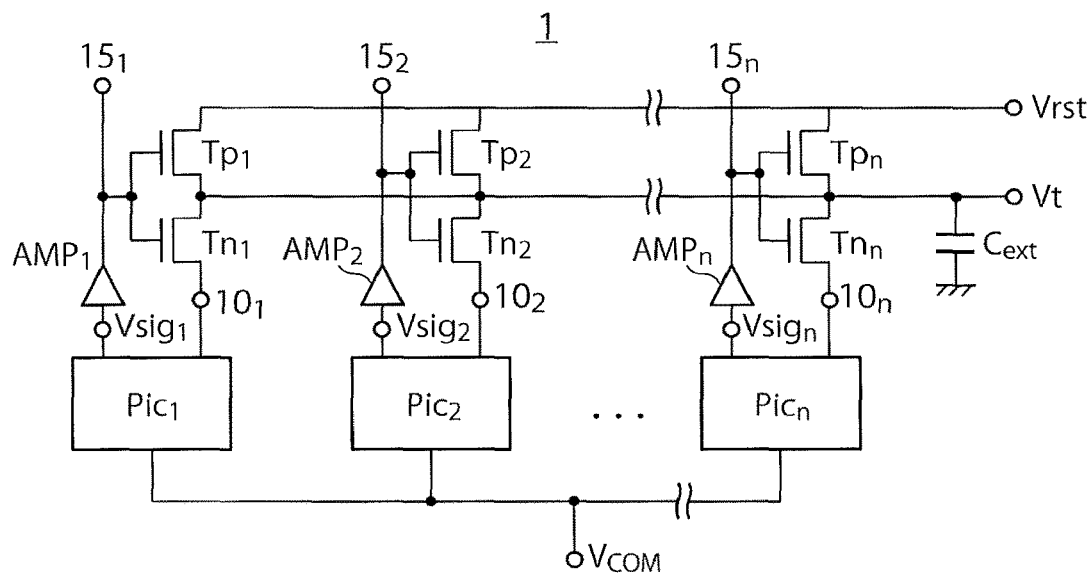
FIG. 15 is a circuit diagram showing a photodetection device according to a second embodiment.

FIG. 15 is a circuit diagram of a photodetection device according to a second embodiment. The photodetection device 1 of the second embodiment has a circuit configuration that includes pixels so that device temperature information about each pixel and each photodetection timing can be read.

The photodetection device 1 of the second embodiment includes pixels $Pic_i$ through $Pic_n$. Each pixel $Pic_i$ (i=1, ..., n) includes an optical signal detecting circuit 2 and a device temperature detecting circuit 3. An enhancement NMOS transistor $Tn_i$ and a depression PMOS transistor $Tp_i$ are connected in series to each terminal $10_i$ that outputs device temperature information $V_{Ti}$ about each corresponding pixel $Pic_i$ (i=1, ..., n). The enhancement NMOS transistor $Tn_i$ and a depression PMOS transistor $Tp_i$ form an inverter. A common reset potential Vrst is applied to the source electrode of each transistor $Tp_i$ (i=1, ..., n).

An optical pulse signal output circuit $Vsig_i$ (i=1, ..., n) is input to a current-voltage converting amplifier $AMP_i$, and is converted into a voltage pulse. This voltage pulse is applied to a terminal $15_i$. The gate electrodes of each transistor $Tn_i$ (i=1, ..., n) and each transistor $Tp_i$ are connected to each corresponding terminal $15_i$, and the output of the inverter formed with the transistor $Tn_i$ and the transistor $Tp_i$ is connected to a device temperature information common potential line Vt.

Figure 16:
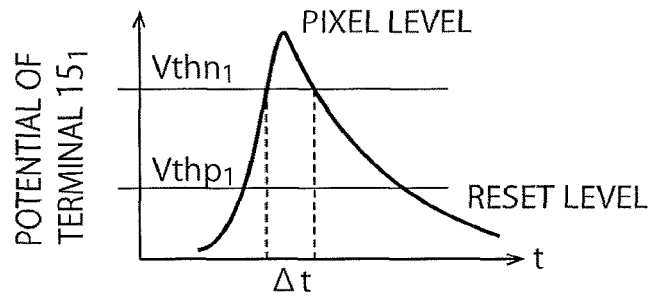
FIG. 16 is a graph showing a pulse-like signal potential induced by a pixel of the photodetection device of the second embodiment when photons enter the pixel.
Figure 17:
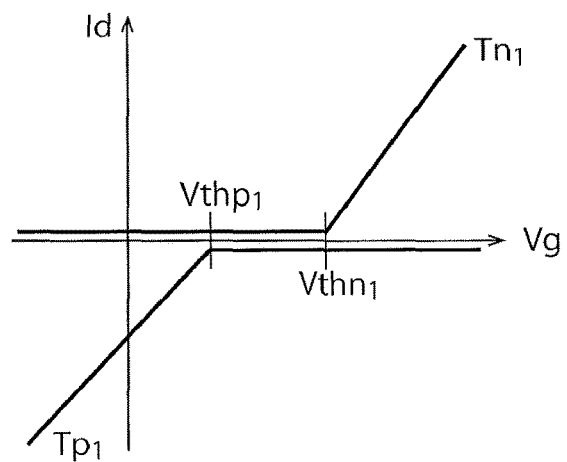
FIG. 17 is a graph showing the switching characteristics of an enhancement NMOS transistor and a depression PMOS transistor used in the photodetection device of the second embodiment.

For example, when photons enter the pixel $Pic_1$, a pulse-like signal potential is induced in the terminal $15_1$, as shown in FIG. 16. The switching characteristics (Id-Vg curves) of the transistors $Tn_1$ and $Tp_1$ are set as shown in FIG. 17. When the wave height of the voltage pulse of the terminal $15_1$ becomes greater than a threshold voltage $Vthn_1$ of the transistor $Tn_1$, the transistor $Tn_1$ is turned on while the transistor $Tp_1$ remains in an off-state. The device temperature information $V_{T1}$ about the pixel $Pic_1$ is then output to the common potential line Vt. The avalanche pulse caused by the photoelectrons generated due to the photons that have entered the pixel $Pic_1$ is terminated by a quenching operation, and the peak value of the avalanche pulse becomes equal to or lower than the threshold voltage $Vthn_1$ of the transistor $Tn_1$. The transistor $Tn_1$ is then turned off. As a result, the common potential line Vt has a voltage value $Vex_1$ defined as $$Vex_1 = Ir_1 \times \Delta t / Cex,$$

due to parasitic capacitance Cex. The device temperature information $V_{T1}$ about the pixel $Pic_1$ is then output as a voltage value from the common potential line Vt. Here, $Ir_1$ represents the reverse saturation dark current of the photodiode $PD_1$ for temperature detection, and $\Delta t$ represents the time when the transistor $Tn_1$ is turned on as shown in FIG. 16.

The wave height of the avalanche pulse then further decreases. When the wave height becomes equal to or lower than the threshold voltage $Vthp_1$ of the transistor $Tp_1$, the transistor $Tp_1$ is turned on, and the common potential line Vt is reset to the common reset potential Vrst.

With the above configuration, device temperature information about each pixel and each photodetection timing can be read, and temperature correction can be performed in more real time. Thus, variation of photon detection efficiency with temperature can be reduced.

As described above, according to the second embodiment, it is possible to provide a photodetection device that can reduce variation of photon detection efficiency with temperature.

(Third Embodiment)

Next, a photodetection device according to a third embodiment is described. The photodetection device of the third embodiment differs from the photodetection device of the first embodiment shown in FIG. 1 in the configuration of the device temperature detecting circuit 3. A device temperature detecting circuit 3 according to the third embodiment adopts a technique for performing temperature correction by using a dark output pulse count of a light-shielded avalanche photodiode that operates in Geiger mode. As described above, a temperature correcting element that has the same structure and performs the same biasing operation as the APD to be used in photodetection is used in the third embodiment. Thus, more accurate temperature correction that takes device variation into account can be performed.

Figure 18:
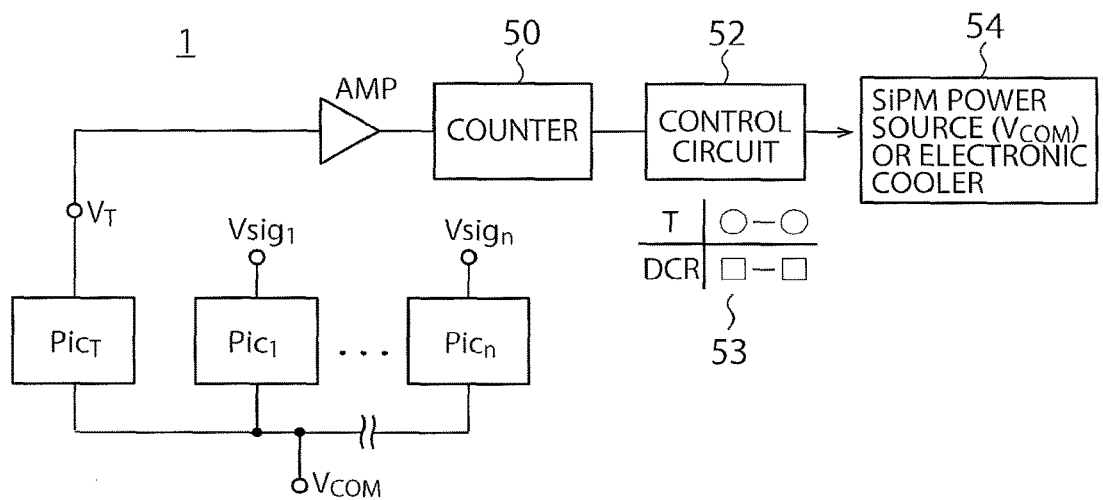
FIG. 18 is a diagram showing a circuit related to temperature correction in a photodetection device according to a third embodiment.

FIG. 18 shows a circuit related to temperature correction in the photodetection device of the third embodiment. The photodetection device 1 of the third embodiment includes photodetection pixels $Pic_1$ through $Pic_n$, and at least one temperature monitoring pixel $Pic_T$. Each pixel $Pic_i$ (i= 1, ..., n) has the same structure as the pixel described in the first embodiment. The temperature monitoring pixel $Pic_T$ has the same structure as each pixel $Pic_i$ (i=1, ..., n), except that a light shielding film is formed on the temperature monitoring pixel $Pic_T$. The photodetection pixels $Pic_1$ through $Pic_n$ and the temperature monitoring pixel $Pic_T$ are connected to a common power source $V_{COM}$. The photodetection pixels $Pic_1$ through $Pic_n$ and the temperature monitoring pixel $Pic_T$ each have a configuration in which cells each including an avalanche photodiode and a quench resistor connected in series as shown in FIG. 1 are arranged in an array, as in the case shown in FIG. 10A.

The output circuits $Vsig_1$ through $Vsig_n$ of the pixels $Pic_1$ through $Pic_n$ output optical pulse signals, and are fixed to a ground potential through an external read circuit (not shown).

Figure 19:
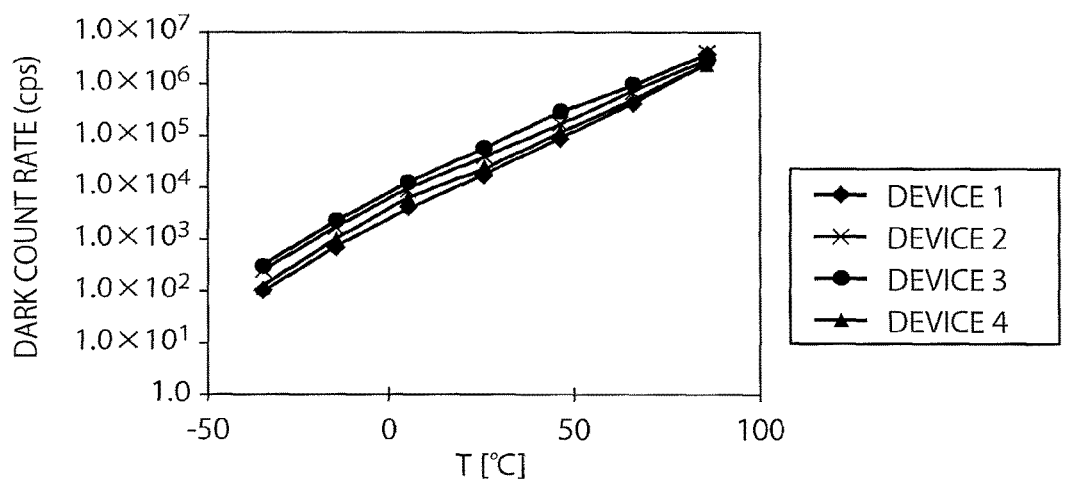
FIG. 19 is a graph showing the correlations between cell temperature and a dark pulse signal detection rate.

The dark pulse signal that is output from the temperature monitoring pixel $PIC_T$ is input to a current-voltage converting amplifier AMP through an output terminal Vt, is converted into a dark pulse number per circuit time by a counter 50, and is output as a dark pulse signal detection rate. FIG. 19 shows the correlations between cell temperature and the dark pulse signal detection rate. As can be seen from FIG. 19, the dark pulse signal detection rate exponentially increases with temperature, and is very sensitive to temperature. In view of this, the accuracy of the temperature monitoring technique in this embodiment is very high.

The dark pulse signal detection rate that is output from the counter 50 is then input to a control circuit 52, is converted into temperature information in accordance with a temperature table 53 prepared in advance, and is fed back to a $V_{COM}$-controlling power source circuit or electronic cooler control circuit 54.

The dark pulse signal indicating the temperature dependence of the cell is an avalanche pulse generated by thermally-excited electrons of the silicon used as the substrate, and its pulse number depends on the cell area or the detection time length. To increase temperature monitoring accuracy, it is necessary to keep a statistically sufficient number of events. To do so, it is necessary to keep a sufficient detection time or a sufficient cell area. An extended detection time leads to a decrease in the frequency of temperature monitoring and degradation of real time properties. Therefore, it is preferable to increase the cell area of the temperature monitoring pixel $Pic_T$.

At this stage, quenching due to a Geiger mode operation occurs in the SiPM. Therefore, if the area per cell is increased, the quenching time or the sensor dead time becomes longer due to an increase in parasitic capacitance. In view of this, it is preferable to allocate a large number of cells for one pixel, and achieve a higher dark pulse generation frequency by increasing the total cell area per pixel.

In a photodetection pixel for distance measurement by a distance measurement method ("time of flight method"), on the other hand, the timing to detect a pulse generated by incident photons should be accurately achieved, but there is no need to generate a histogram through event number accumulation. That is, the cell parasitic capacitance is preferably low because of the pulse bandwidth, and the cell area is preferably small, as long as a sufficiently high photodetection efficiency can be achieved. At the same time, to reduce the increase in chip area, it is preferable to minimize the number of cells of photodetection pixels that are prepared to form an array.

In view of this, the size of each of the photodetection pixels $Pic_1$ through $Pic_n$ is approximately 100 cells per pixel, and the size of the temperature monitoring pixel $Pic_T$ is 1000 cells per pixel in this embodiment. That is, the number of cells of the temperature monitoring pixel $Pic_T$ is set at a value that is 10 times larger than the number of cells of each of the photodetection pixels $Pic_1$ through $Pic_n$.

As described above, according to the third embodiment, it is possible to provide a photodetection device that can reduce variation of photon detection efficiency with temperature.

(Fourth Embodiment)

Figure 20:
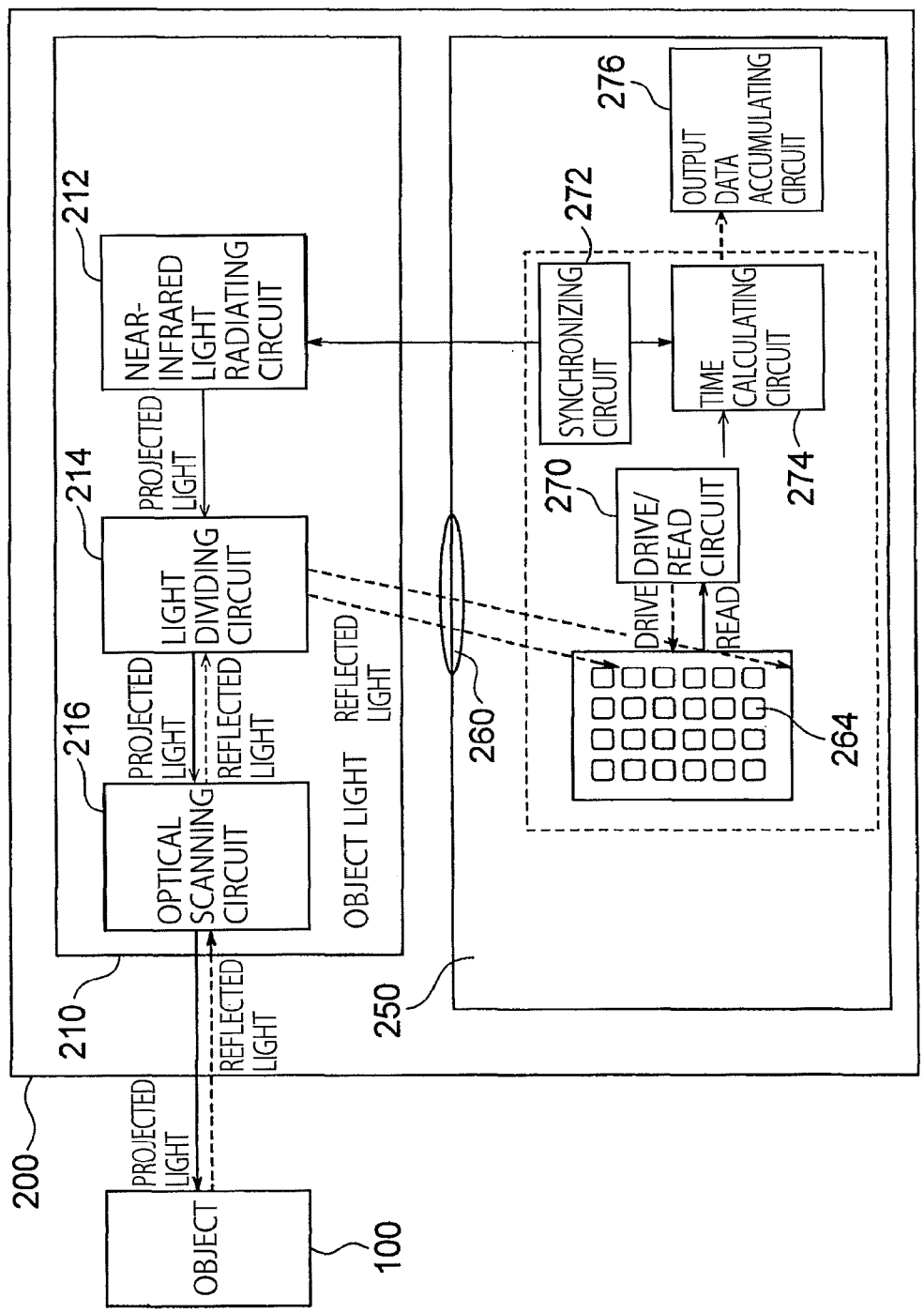
FIG. 20 is a block diagram showing a long-distance object detection system according to a fourth embodiment.

FIG. 20 shows an object detection system according to a fourth embodiment. The object detection system 200 of this embodiment includes a light projecting circuit 210 and a light detecting circuit 250. The light projecting circuit 210 projects light onto an object 100, and the light is reflected by the object 100. The light detecting circuit 250 detects the reflected light returning in the same direction as the projecting direction, and calculates the return time (time of flight of light), the intensity, and the like of the reflected light. The distance to the object 100 is estimated from the time of flight of light, and the reflectance and the like of the object 100 are estimated from the light intensity.

The light projecting circuit 210 includes: a near-infrared light radiating circuit 212 that projects near-infrared light, for example; a light dividing circuit 214 that has a beam splitter, for example, to divide projected light and light reflected from the object; and an optical scanning circuit 216 that two-dimensionally scans light in directions parallel and perpendicular to the object 100. The light that is reflected from the object 100 and returns in the same direction as the projecting direction re-enters the optical scanning circuit 216, and is then guided to the light detecting circuit 250 by the light dividing circuit 214.

The light detecting circuit 250 includes: a collecting lens 260 that collects light from the light dividing circuit 214; a light detector 264 that detects the intensity of light; a drive/read circuit 270 that drives the light detector 264 and reads the intensity of light from the light detector 264; a synchronizing circuit 272 that achieves synchronization of timing of light projected from the near-infrared light radiating circuit 212; a time calculating circuit 274 that calculates the return time of the light projected from the near-infrared light radiating circuit 212, using the synchronized timing supplied from the synchronizing circuit 272; and a data accumulating circuit 276 that accumulates two-dimensional information and time information about the object 100.

In the fourth embodiment, the photodetection device 1 of one of the first through third embodiments or one of the modifications thereof is used as the light detector 264 that detects near-infrared light reflected by the object 100. Thus, the object detection system 200 of the fourth embodiment can provide an object detection system that can reduce variation of photon detection efficiency with temperature, as in the first through third embodiments.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A photodetection device comprising:
a pixel including an avalanche photodiode and a resistor connected in series to the avalanche photo diode;
a voltage source configured to apply voltage to the pixel;
a device temperature detecting circuit including a temperature detecting element configured to detect a temperature of the pixel, the temperature detecting element including a photodiode having an identical semiconductor structure with the avalanche photodiode; and
a voltage applying circuit configured to apply a reverse voltage to the temperature detecting element, the reverse voltage being lower than a breakdown voltage of the photodiode.

2. The photodetection device according to claim 1, wherein the temperature detecting element further includes a light shielding structure disposed on an upper surface of the photodiode.

3. The photodetection device according to claim 1, wherein the voltage applying circuit includes at least two capacitances connected in series between the voltage source and a ground.

4. The photodetection device according to claim 1, wherein the device temperature detecting circuit further includes a selecting circuit configured to cause the device temperature detecting circuit to operate in accordance with an output pulse signal from the avalanche photodiode.

5. The photodetection device according to claim 4, wherein
the selecting circuit includes: an N-channel MOS transistor including a gate terminal configured to receive the output pulse signal from the avalanche photodiode, a source terminal, and a drain terminal connected to an output terminal of the temperature detecting element; and a P-channel MOS transistor including a gate terminal configured to receive the output pulse signal from the avalanche photodiode, a source terminal connected to the source terminal of the N-channel MOS transistor, and a drain terminal configured to receive a predetermined reset potential, and
temperature information is output from the source terminal of the N-channel MOS transistor and the source terminal of the P-channel MOS transistor.

6. The photodetection device according to claim 1, wherein the device temperature detecting circuit includes a counting circuit configured to count pulse outputs of the temperature detecting element, and the device temperature detecting circuit outputs a temperature of the pixel.

7. A photodetection device comprising:
a plurality of pixels arranged in a line, each pixel including an avalanche photodiode and a resistor connected in series to the avalanche photodiode;
a voltage source configured to apply voltage to the plurality of pixels; and
a device temperature detecting circuit including first and second temperature detecting elements disposed at both ends of the pixels arranged in the line, the first and second temperature detecting elements each including a photodiode having an identical semiconductor structure with a corresponding avalanche photodiode of the pixels at the both ends, and the device temperature detecting circuit determining a temperature of each of the pixels, in accordance with outputs of the first and second temperature detecting elements;
a first voltage applying circuit configured to apply a first reverse voltage to the first temperature detecting element, the first reverse voltage being lower than a breakdown voltage of the photodiode of the first temperature detecting element; and
a second voltage applying circuit configured to apply a second reverse voltage to the second temperature detecting element, the second reverse voltage being lower than a breakdown voltage of the photodiode of the second temperature detecting element.

8. An object detection system comprising:
a light projecting circuit configured to project light;
a light dividing circuit configured to divide the light and reflected light reflected from an object;
an optical scanning circuit configured to scan the projected light in a direction toward the object;
a photodetection device configured to detect the reflected light divided by the light dividing circuit;
a drive/read circuit configured to drive the photodetection device and read an intensity of the reflected light from the photodetection device;
a synchronizing circuit configured to achieve synchronization of timing of the light projected from the light projecting circuit; and
a time calculating circuit configured to calculate a return time of the light projected from the light projecting circuit, using the synchronized timing supplied from the synchronizing circuit,
wherein the photodetection device is the photodetection device according to claim 1.

9. The system according to claim 8, wherein the voltage applying circuit includes at least two capacitances connected in series between the voltage source and a ground.

10. The system according to claim 8, wherein the device temperature detecting circuit further includes a selecting circuit configured to cause the temperature detecting circuit to operate in accordance with an output pulse signal from the avalanche photodiode.

11. The system according to claim 10, wherein
the selecting circuit includes: an N-channel MOS transistor including a gate terminal configured to receive the output pulse signal from the avalanche photodiode, a source terminal, and a drain terminal connected to an output terminal of the temperature detecting element; and a P-channel MOS transistor including a gate terminal configured to receive the output pulse signal from the avalanche photodiode, a source terminal connected to the source terminal of the N-channel MOS transistor, and a drain terminal configured to receive a predetermined reset potential, and
temperature information is output from the source terminal of the N-channel MOS transistor and the source terminal of the P-channel MOS transistor.

12. The system according to claim 8, wherein the device temperature detecting circuit includes a counting circuit configured to count pulse outputs of the temperature detecting element, and the temperature detecting circuit outputs a temperature of the pixel.

13. The photodetection device according to claim 7, wherein the first temperature detecting element and the second temperature detecting element each include a light shielding structure disposed on an upper surface of a corresponding photodiode.

* * * * *